(12) United States Patent
Lee et al.

(10) Patent No.: US 7,470,933 B2
(45) Date of Patent: *Dec. 30, 2008

(54) ORGANIC LIGHT EMITTING DISPLAY DEVICE

(75) Inventors: Kwan-Hee Lee, Seoul (KR); Jang-Hyuk Kwon, Suwon-si (KR); Seoung-Yoon Ryu, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 326 days.

This patent is subject to a terminal disclaimer.

(21) Appl. No.: 11/149,557

(22) Filed: Jun. 10, 2005

(65) Prior Publication Data

US 2005/0280355 A1   Dec. 22, 2005

(30) Foreign Application Priority Data

Jun. 18, 2004   (KR) ...................... 10-2004-0045724

(51) Int. Cl.
H01L 27/15 (2006.01)
H01L 31/12 (2006.01)
H01L 33/00 (2006.01)
H01L 35/24 (2006.01)

(52) U.S. Cl. ............................. 257/79; 257/40; 257/94; 257/96

(58) Field of Classification Search ................... 257/60, 257/79, 94, 96–97, 59, 72, 40; 313/504, 313/506

See application file for complete search history.

(56) References Cited

U.S. PATENT DOCUMENTS 6,541,130 B2 *   4/2003   Fukuda .......................... 428/690
6,811,808 B2 *  11/2004   Ohshita et al. ................ 427/66
7,279,232 B2 * 10/2007   Knowles et al. ............. 428/690
2003/0068583 A1 *   4/2003   Okunaka et al. ............ 430/319
2003/0156239 A1 *   8/2003   Inoue et al. .................. 349/113
2004/0183435 A1 *   9/2004   Ohshita ....................... 313/506

(Continued)

FOREIGN PATENT DOCUMENTS

JP         4-137485         5/1992

(Continued)

*Primary Examiner*—Shouxiang Hu
(74) *Attorney, Agent, or Firm*—H.C. Park & Associates, PLC

(57) ABSTRACT

An organic light emitting display device may include: a substrate having first, second and third pixel regions. A first electrode layer may be formed in each of the first, second and third pixel regions on the substrate. A hole injection layer may be formed over an entire surface of the substrate on the first electrode layers. A first hole transport layer may be formed on the first electrode layers in the first, second and third pixel region. A second hole transport layer may be formed on the first hole transport layer in any two adjacent pixel regions among the first, second and third pixel regions. A third hole transport layer may be formed on the second hole transport layer in any one of the two adjacent pixel region. A first, second and third organic emission layers may be formed on the first, second and third hole transport layer. A second electrode layer may be formed on the first, second and third organic emission layers. An OLED configured in this or a similar manner benefits from uniform operating characteristics and reducing tac time.

25 Claims, 1 Drawing Sheet

U.S. PATENT DOCUMENTS

2005/0249972 A1 * 11/2005 Hatwar et al. ............... 428/690

FOREIGN PATENT DOCUMENTS

| JP | 4-328295 | 11/1992 |
| JP | 7-240277 | 9/1995 |
| JP | 2000323277 | 11/2000 |
| JP | 2002367787 | 12/2002 |
| JP | 2003142277 | 5/2003 |

* cited by examiner

ORGANIC LIGHT EMITTING DISPLAY DEVICE

CROSS-REFERENCE TO RELATED APPLICATIONS

This application claims priority to Korean Patent Application No. 2004-45724, filed Jun. 18, 2004, the disclosure of which is incorporated herein by reference in its entirety.

BACKGROUND OF THE INVENTION

1. Field of the Invention

The present invention relates to an organic light emitting display device (OLED) and method of fabricating the same and, more particularly, to an easily fabricated organic light emitting display device having uniform display characteristics and method of fabricating the same.

2. Description of the Related Art

Active and passive matrix OLEDs incorporate thin film transistors and have attracted attention in recent years as providing an alternative to cathode ray tube (CRT) devices because OLEDs offer wider viewing angle, better contrast, and faster response speed.

OLEDs may be classified as organic or inorganic depending on the type of electroluminescent (EL) material used to form the emission layer of each pixel. The organic EL device has advantages of excellent luminance, low driving voltage, fast response speed, and realization of multi-colors, as compared to an inorganic EL device.

Further, an organic light emitting display device may comprise a full-color flat panel display device by implementing red, green, and blue colors on respective pixel regions, which are defined by a plurality of scan lines and a plurality of data lines that are formed perpendicular to the scan lines.

FIG. 1 is a cross-sectional view of a conventional full-color organic light emitting display device 1. In the conventional organic EL device 1, first electrode layers 12 are each formed in a predetermined pattern on a substrate 10 having red, green and blue color pixel regions to emit red, green and blue colors R, G, and B. In a top-emission organic light emitting display device, each of the first electrode layers 12 is formed of a reflective material such as metal, or is formed of a transparent material backed with a layer of reflective material.

An insulating material is deposited in the gaps between electrode layers 12 to form a pixel defining layer 14, which is then patterned to form an opening above each electrode layer 12. In this manner, the insulating material separates the respective pixel regions to define individual pixels.

The hole injection layer 16 may be covered with a hole transport layer 18 to create a common layer over the entire surface of the substrate that encapsulates the first electrode layers 12.

Subsequently, light emitting materials corresponding to the respective pixel regions may be deposited on the hole transport layer 18 to form red, green, and blue emission layers 20.

A hole blocking layer (not shown), an electron transport layer (not shown), and an electron injection layer 22 are sequentially formed over the entire surface of the substrate. A second electrode layer (not shown) having a pre-determined pattern may be formed on the electron injection layer 22, if necessary. The hole injection layer 16, the hole transport layer 18, the emission layer 20, the hole blocking layer, the electron transport layer, and the electron injection layer 22 may be organic thin films made of an organic compound.

However, in the full-color organic light emitting display device 1, there arises a difference in luminous efficiency between the differently colored pixels. That is, a red-colored light-emitting material has superior luminous efficiency as compared to green-colored and blue-colored light-emitting materials. Additionally, the green-colored light-emitting material has superior luminous efficiency to the blue-colored light-emitting material.

Accordingly, there have been many conventional attempts to control the thickness of organic thin films in order to obtain maximum efficiency and luminance. For example, Japanese Patent Laid-open No. Hei 4-137485 discloses a technique in which, in a configuration having an anode, a hole transport layer, an emission layer, an electron transport layer and a cathode formed in sequence, the thickness of the electron transport layer is set to about 30 nm to about 60 nm to enhance the luminous efficiency.

Further, Japanese Patent Laid-open No. Hei 4-328295 discloses a technique in which the thickness of an electron transport layer is adjusted so that the luminance substantially increases when light emitted from an emission layer and light reflected by a cathode interfere therewith. Further, Japanese Patent Laid-open No. Hei 7-240277 discloses an organic light emitting display device in which optical film thickness is controlled to improve luminance, in particular, to increase color purity of blue-color emission.

In these organic light emitting display devices, a different optical thickness is set for each color to improve the luminance. However, it is difficult to make the optical thickness different for each color in mass production because each color requires a different manufacturing process or step.

SUMMARY OF THE INVENTION

The present invention solves the aforementioned problems associated with conventional devices by providing an organic light emitting display device having uniform display characteristics for each of red, green and blue pixels, and a method for fabricating the same.

In an exemplary embodiment of the present invention, an organic light emitting display device includes a substrate having first, second, and third pixel regions. First electrode layers are formed in each of the first, second and third pixel regions on the substrate. A hole injection layer is formed on the first electrode layers and over an entire surface of the substrate. A first hole transport layer is formed on the first electrode layers in the first, second and third pixel region. A second hole transport layer is formed on the first hole transport layer in two adjacent pixel regions among the first, second and third pixel regions. A third hole transport layer is formed on the second hole transport layer in any one of the two adjacent pixel regions. First, second, and third organic emission layers are formed on the first, second, and third hole transport layers. A second electrode layer may be formed on the first, second, and third organic emission layers.

In an exemplary embodiment of the present invention, a method of fabricating an organic light emitting display device may include the following steps, which may be performed in virtually any order. First electrode layers on the substrate are formed and patterned on a substrate A pixel defining layer is formed on the first electrodes and over the entire surface of the substrate and patterned to define an emission region in each of the first, second, and third pixel regions. A hole injection layer is formed over the entire surface of the substrate. A first hole transport is layer formed on the hole injection layer. A second hole transport layer is formed only on both the second pixel region and the third pixel region. A third hole transport layer is formed only on the third pixel region. Each of the first, second, and third light emitting materials in the respective pixel regions are patterned to form first, second, and third emission layers. A second electrode may be formed on the emission layers.

BRIEF DESCRIPTION OF THE DRAWINGS

The above and other features of the present invention will be described in reference to certain exemplary embodiments thereof with reference to the attached drawings.

DETAILED DESCRIPTION

Figure 1:
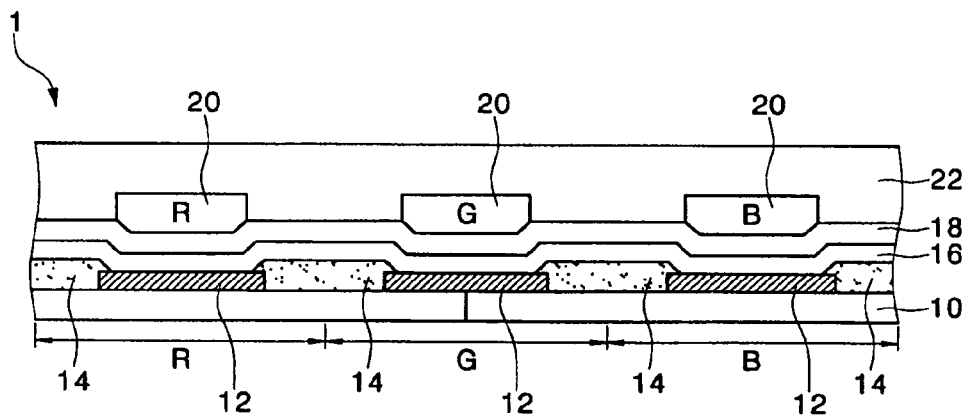
FIG. 1 is a cross-sectional view of a conventional organic light emitting display device.

The embodiments of the invention and the various features and advantageous details thereof are explained more fully with reference to the non-limiting embodiments and examples that are described and-or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and manufacturing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals may represent similar parts throughout the several views of the drawings.

Figure 2:
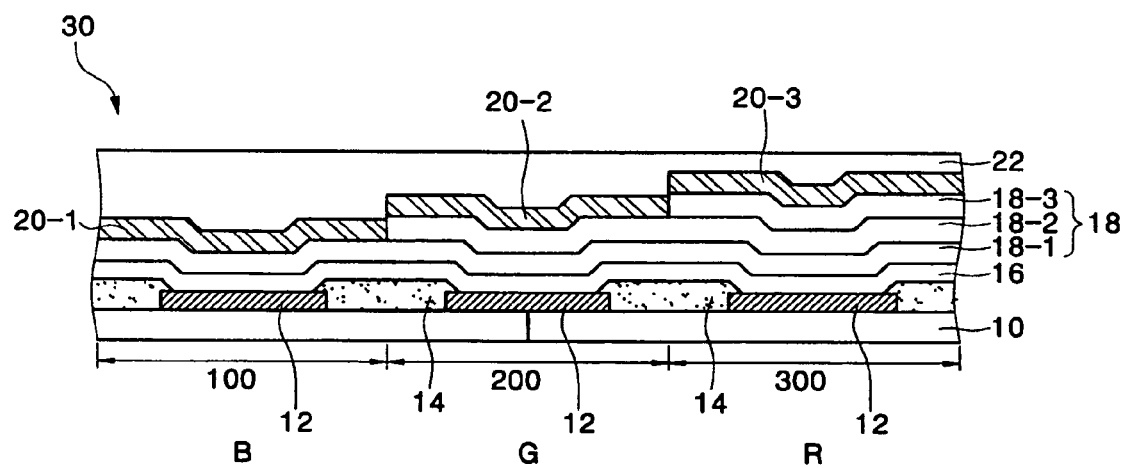
FIG. 2 is a cross-sectional view of an organic light emitting display device according to an exemplary embodiment of the present invention.

FIG. 2 is a schematic cross-sectional view of the structure of an organic light emitting display device 30 according to one embodiment of the present invention. Referring to FIG. 2, in the OLED 30, first electrode layers 12 are formed in first a pixel region 100, a second pixel region 200, and a third pixel region 300, respectively, on a substrate 10.

The respective first, second, and third pixel regions implement different colors. Further, each pixel region implements any one of a red, a green and blue color. In other words, for example, when the first pixel region 100 implements the red color and the second pixel region 200 implements the green color, the third pixel region 300 implements the blue color, and when the first pixel region 100 implements the green color and the second pixel region 200 implements the blue color, the third pixel region 300 implements the red color. Any similar combinations may define the respective pixel regions.

Meanwhile, the insulating substrate 10 may comprise any suitably insulating material, including, but not limited to, glass, plastic, or the like.

Each of the first electrode layers 12 may be formed of a reflective material, preferably one selected from a group consisting of Al, an alloy of Al, Ag, Ca, and Mg/A. Alternatively, each of the first electrode layers 12 may be formed of a transparent material backed with a layer of reflective material. Preferably, the reflective material is selected from the group consisting of Al, an alloy of Al, or Ag, and the transparent material is selected from the group consisting of ITO, IZO or the like.

A pixel defining layer 14 is then formed on the first electrode layers 12 and is patterned to form an opening in the emission regions above each of the electrode layer 12. Preferably, an organic insulating layer such as benzocyclobutene (BCB), acryl resin, or the like is used as the pixel defining layer 14.

Thereafter, a hole injection layer 16 may be formed to cover the first electrode layers 12 and each of the pixel defining layers 14. Thus, the hole injection layer 16 should be formed in a continuous layer over the entire surface of the substrate including over the respective pixel regions. For the hole injection layer 16, a material, such as, but not limited to, copper phthalocynine (CuPc), 4,4',4"-tris(N-(3-methylphenyl)-N-phenylamino)triphenylamine)(MTDATA), or the like may be employed.

A first hole transport layer 18-1 may be formed on the hole injection layer 16 over the entire surface of the substrate. Preferably the first hole transport layer 18-1 is formed as a single continuous layer.

a high-definition mask may be used to form a second hole transport layer 18-2 on the first hole transport layer 18-1 to extend over both the second pixel region 200 and the third pixel region 300, but not the first pixel region 100. In other words, although pixel region 200 and pixel region 300 are covered by both the second hole transport layer 18-2, and the first hole transport layer 18-1, pixel region 100 is covered only with the first hole transport layer 18-1.

Thereafter, the high-definition mask may be used to form a third hole transport layer 18-3 using the high-definition mask to cover only the third pixel region 300, and not the first pixel region 100 and second pixel region 200. In other words, pixel region 300 may be covered by the first hole transport layer 18-1, second hole transport layer 18-2, and third hole transport layer 18-3, while pixel region 200 is covered with the first HTL 18-1 and second HTL 18-2, while pixel region 100 is covered only with first HTL 18-1. In this manner, a different thickness of hole transport layer 18 will be formed in each of the first pixel region 100, second pixel region 200, and third pixel region 300.

The hole transport layer 18 may comprise any suitable material, including, but not limited to, N,N'-di(1-naphtyl)-N, N'-diphenylbenzidine (NPD), triphenyldiamine (TPD), polyethylenethioxythiophene (PEDOT), or the like.

In another embodiment, the first hole transport layer 18-1, the second hole transport later 18-2, and the third hole transport layer 18-3 may each be formed of a different material. Alternatively, any two layers of the first, second and third hole transport layers may be formed of the same material. Alternatively, each of the first, second and third hole transport layers may be formed of the same material. Of course, other variations are possible.

The first hole transport layer 18-1 may be about 10 nm to about 60 nm thick. The range of thickness depends on the thickness of the hole injection layer 16 and the hole transport layer 18, which together form a full-color display device. Preferably, the second hole transport layer 18-2 is about 40 nm to about 70 nm thick. This thickness may vary depending on the thicknesses of a first light emitting color layer and a second light emitting color layer, and is determined by a difference in thickness between the first emission layer and the second emission layer because an optimal thickness differs for each color. Preferably, the third hole transport layer 18-3 is about 40 nm to about 70 nm thick. The thickness of the third hole transport layer 18-3 may vary depending on a difference in thickness between the second emission layer and the third emission layer.

Subsequently, first, second, and third light emitting materials are patterned to form first emission layer 20-1, second emission layer 20-2 and third emission layer 20-3 on the hole transport layer 18. In an OLED manufactured in accordance with the principles of the present invention, the first pixel region 100 should implement blue, the second pixel region 200 should incorporate green, and the third pixel region 300 should incorporate red, respectively, in order to create a full-color OLED. In view of the display characteristics, particularly, the luminous efficiency, which increases in an order of the blue color, the green color and the red color, the thickest region in the hole transport layer should implement the red color, a thinner region should implement the green color, and the thinnest region should implement the blue color.

Accordingly, it is preferable that the blue-color emission layer 20-1 is formed in the first pixel region 100, the green-color emission layer 20-2 is formed in the second pixel region 200, and the red-color emission layer 20-3 is formed in the third pixel region 300.

The red-color emission layer may be formed of a phosphorescent material containing carbazole biphenyl (CBP) or monochlorophenols (mCP) as a host material and containing at least one selected from a group consisting of PlQIr(acac) (bis(1-phenylisoquinoline)acetylacetonate iridium), PQIr (acac)(bis(1-phenylquinoline)acetylacetonate iridium), PQIr (tris(1-phenylquinoline)iridium), and PtOEP (octaethylporphyrin platinum) as a dopant material. Alternatively, the red-color emission layer may be formed of a fluorescent material such as PBD:Eu(DBM)$_3$(Phen) or Perylene.

The green-color emission layer may be formed of a phosphorescent material containing the CBP or the mCP as a host material and containing Ir(ppy)3(fac tris(2-phenylpyridine) iridium) as a dopant material. Alternatively, the green-color emission layer may be formed using a fluorescent material such as Alq3(tris(8-hydroxyquinolino)aluminum.

The blue color emission layer may be formed of a fluorescent material containing a material selected from a group consisting of DPVBi, spiro-DPVBi, spiro-6P, distyrilbenzene (DSB), distyrylarylene (DSA), PFO-based polymer, and PPV-based polymer. The blue-color emission layer may be formed of the above-mentioned fluorescent materials, as using a phosphorescent material may generate unstable optical characteristics.

The R, G, and B emission layers may be formed using conventional manufacturing methods, such as laser induced thermal imaging (LITI), an inkjet, a vacuum deposition, or the like.

The second electrode layer may be formed to be a transmissive metal electrode comprising any one of Ca, Mg/Ag and Al.

Meanwhile, the organic light emitting display device of the present invention may further include, as a common layer 22, at least one of a hole blocking layer, an electron transport layer, and an electron injection layer on the emission layer.

Any suitable material(s) may be used for the hole blocking layer, the electron transport layer, and the electron injection layer. For example, Biphenoxy-bi(8-quinolitolato)aluminum (Balq) may be used for the hole blocking layer. A polycyclic hydrocarbon-based derivative, a heterocyclinic compound, tris(8-quinolinolato)aluminum (Alq3) may be used for the electron transport layer. And, a material such as LiF or the like may be used for the electron injection layer.

In one exemplary embodiment, the OLED 30 may further include a passivation layer (not shown) on a second electrode layer (not shown). Any suitable material(s) having a refractive index of at least 1.5 and a transmissivity of at least 70% may be used for the passivation layer. Illustratively, such organic materials include, but are not limited to, Alq$_3$, NPB, CBP or the like. On the other hand, inorganic material having a refractive index of at least 1.5, such as, but not limited to, oxide-based materials, SiO$_2$, SnO$_2$, SiO, and TiO$_2$, a nitride-based material Si$_3$N$_4$, or ZnS may be used.

Meanwhile, although not shown, the OLED 30 of the present invention may further include one or more thin film transistors.

Thus, an OLED manufactured according to the principles of the present invention may improve the display characteristics, particularly, luminous efficiency, by manufacturing the hole transport layer to be a different thickness for each of the red, green and blue pixels. Further, tac time may be reduced by patterning the second pixel region and the third pixel region in common using a high-definition mask when the second hole transport layer is formed.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device, comprising:
   a substrate having a first pixel region, a second pixel region, and a third pixel region formed thereon;
   a first electrode formed in each of the first, second, and third pixel regions;
   a hole injection layer formed on the first electrodes and over an entire surface of the substrate;
   a first hole transport layer formed on the first electrode layer and the hole injection layer in the first pixel region, the second pixel region, and the third pixel region, and extending continuously therebetween;
   a second hole transport layer formed on the first hole transport layer in any two adjacent pixel regions among the first pixel region, the second pixel region, and the third pixel region, and extending continuously between the two adjacent pixel regions;
   a third hole transport layer formed on the second hole transport layer in any one region of the two adjacent pixel regions;
   a first organic emission layer formed on and in contact with the first hole transport layer;
   a second organic emission layer formed on and in contact with the second hole transport layer;
   a third organic emission layer formed on the third hole transport layer; and
   a second electrode formed on each of the first organic emission layer, the second organic emission layer, and the third organic emission layer.

2. The device of claim 1, wherein the first pixel region, the second pixel region and the third pixel regions implement different colors from each other and each region implements any one of red color, green color and blue color.

3. The device of claim 2, wherein the first pixel region implements the blue color, the second pixel region implements the green color, and the third pixel region implements the red color.

4. The device of claim 1, wherein the first hole transport layer, second hole transport layer, and third hole transport layer are each formed of different materials.

5. The device of claim 1, wherein two layers of the first hole transport layer, second hole transport layer, and third hole transport layer are formed of the same material.

6. The device of claim 1, wherein the first hole transport layer, the second hole transport layer and the third hole transport layer are formed of the same material.

7. The device of claim 1, wherein the first hole transport layer is formed in as a single layer.

8. The device of claim 1, wherein the first hole transport layer is about 10 nm to about 50 nm thick.

9. The device of claim 1, wherein the second hole transport layer is either about 40 nm to about 60 nm or about 80 nm to about 100 nm thick.

10. The device of claim 1, wherein the third hole transport layer is about 30 nm to about 50 nm thick.

11. The device of claim 1, wherein the first electrodes are formed of a reflective material and the second electrode is formed of a transparent material.

12. The device of claim 1, wherein the first electrodes comprise a transparent material on a reflecting layer, and the second electrode is formed of a transmissive material.

13. The device of claim 12, wherein the transmissive material is any one of Ca, Mg/Ag, Al, and Li.

14. The device of claim 1, further comprising a common layer on the first, second, and third organic emission layers, the common layer comprising at least one of a hole blocking layer, an electron transport layer, and an electron injection layer.

15. The device of claim 1, further comprising a passivation layer on the second electrode.

16. The device of claim 1, wherein each of the first, second and third hole transport layers is formed of at least one of N,N'-di(1-naphtyl)-N,N'-diphenylbenzidine (NPD), and triphenyldiamine (TPD).

17. An organic light emitting display device, comprising:
a substrate having a first pixel region, a second pixel region, and a third pixel region formed thereon;
a first electrode formed in each of the first, second, and third pixel regions;
a hole injection layer formed on the first electrodes and over an entire surface of the substrate;
a first hole transport layer formed on the first electrodes and on the hole injection layer in the first pixel region, the second pixel region, and the third pixel region, and extending continuously therebetween;
a second hole transport layer formed on the first hole transport layer in only two adjacent pixel regions among the first pixel region, the second pixel region, and the third pixel region, and extending continuously between the two adjacent pixel regions;
a third hole transport layer formed on the second hole transport layer in only one region of the two adjacent pixel regions;
a first organic emission layer formed on and in contact with the first hole transport layer;
a second organic emission layer formed on and in contact with the second hole transport layer;
a third organic emission layer formed on the third hole transport layer; and
a second electrode formed on each of the first organic emission layer, the second organic emission layer, and the third organic emission layer.

18. The device of claim 17, wherein the first hole transport layer, second hole transport layer, and third hole transport layer are each formed of different materials.

19. The device of claim 17, wherein two layers of the first hole transport layer, second hole transport layer, and third hole transport layer are formed of the same material.

20. The device of claim 17, wherein the first hole transport layer, the second hole transport layer and the third hole transport layer are formed of the same material.

21. The device of claim 17, wherein the first hole transport layer is formed as a single layer.

22. The device of claim 17, wherein the first hole transport layer is about 10 nm to about 50 nm thick.

23. The device of claim 17, wherein the second hole transport layer is either about 40 nm to about 60 nm or about 80 nm to about 100 nm thick.

24. The device of claim 17, wherein the third hole transport layer is about 30 nm to about 50 nm thick.

25. The device of claim 17, wherein each of the first, second and third hole transport layers is formed of at least one of N,N'-di(1-naphtyl)-N,N'-diphenylbenzidine (NPD), and triphenyldiamine (TPD).

* * * * *